United States Patent

Saxena

[15] 3,694,719

[45] Sept. 26, 1972

[54] SCHOTTKY BARRIER DIODE

[72] Inventor: Arjun Nath Saxena, Princeton Jct., N.J.

[73] Assignee: RCA Corporation

[22] Filed: Nov. 27, 1970

[21] Appl. No.: 92,968

[52] U.S. Cl. ......317/234 R, 317/235 U, 317/235 AH

[51] Int. Cl. ................................................H01l 9/00

[58] Field of Search .....................317/235 U, 235 AH

[56] References Cited

UNITED STATES PATENTS

| | | | |
|---|---|---|---|
| 3,271,201 | 9/1966 | Pomerantz | 317/235 |
| 3,411,053 | 11/1968 | Wiesner | 317/234 |
| 3,463,971 | 8/1969 | Soshea et al. | 317/235 |
| 3,540,010 | 11/1970 | Heightley et al. | 317/235 |

OTHER PUBLICATIONS

IBM Tech. Discl. Bul., " Fabricating Schottky Barrier Photodiodes and Diode Arrays" by Arantha et al., June 1969 pp. 11– 12

*Primary Examiner*—Jerry D. Craig
*Attorney*—Glenn H. Bruestle

[57] ABSTRACT

A Schottky barrier diode includes a body of a semiconductor material of one conductivity type having a guard ring region of the opposite conductivity type therein at a surface of the body. The guard ring extends along the surface of the body in a closed path. A layer of an insulating material is on the surface of the semiconductor body and has an opening therethrough extending to the area of the semiconductor body surface within the guard ring. A metal layer is on the surface of the semiconductor body within the opening in the insulating layer and forms a surface barrier rectifying junction with the semiconductor body. The metal film is also coated on the insulating layer and extends over the guard ring.

5 Claims, 1 Drawing Figure

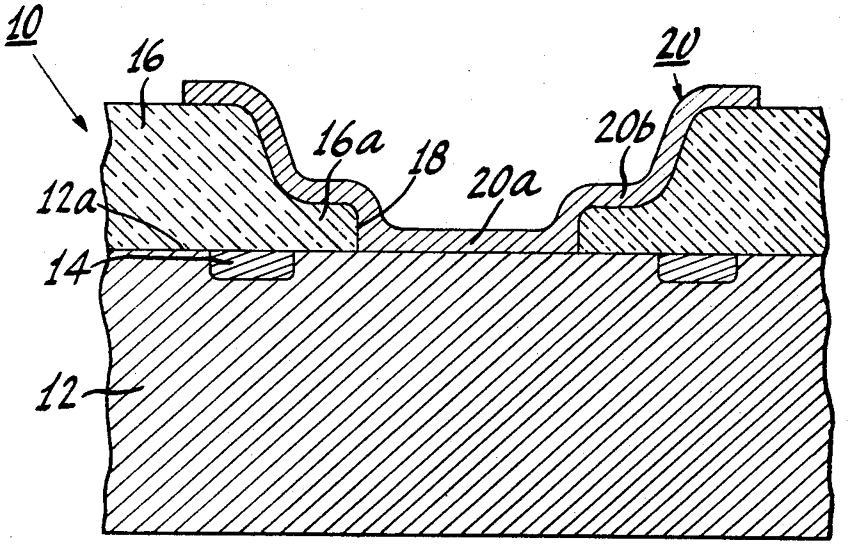
Inventor:
ARJUN N. SAXENA
By Donald S. Cohen
Attorney

SCHOTTKY BARRIER DIODE

BACKGROUND OF THE INVENTION

The present invention relates to a Schottky barrier diode which preserves the majority carrier conduction in the forward direction while maintaining high voltage breakdown in the reverse direction.

A Schottky barrier diode is a semiconductor diode having a metal to semiconductor material surface barrier rectifying junction. Such diodes generally comprise a metal film coated directly on the surface of a body of a semiconductor material, such as silicon, germanium or a group III–V semiconductor compound. A problem with such diodes is that high electrical fields are created at the edge of the metal layer. These high electrical fields give rise to excess leakage currents and hence a lowering of the breakdown voltage in the reverse direction of the diode.

A technique which has been developed to over-come the problem of the edge effect is to provide a PN junction guard ring in the semiconductor body which circumscribes the edge of the metal film. The guard ring is a narrow region of a conductivity type opposite to that of the semiconductor body formed in the semiconductor body at the surface thereof generally by diffusing a conductivity modifier impurity into the body. The guard ring extends completely along the edge of the metal film contacting the guard ring. Although this PN junction guard ring satisfactorily eliminates the high-field edge effects, it creates another effect which can adversely affect the operation of the diode.

One of the most important characteristics of a Schottky barrier diode is that it has near zero storage time because the conduction in the forward direction is primarily caused by the majority carriers. Thus, Schottky barrier diodes are very fast. However, when the diode is provided with a PN junction guard ring to eliminate the high-field edge effects and maintain high breakdown voltage, the PN junction is forward biased along with the surface barrier junction. Thus, the current in the diode is caused by minority carriers provided by the PN junction as well as majority carriers provided by the surface barrier junction. It has been found that when the forward bias is above a certain level, depending on the size of the PN junction guard ring, the minority carrier provided by the PN junction introduce significant storage time effect. Thus, the PN junction guard ring can destroy the important characteristic of the Schottky barrier diode of zero storage time.

SUMMARY OF THE INVENTION

A semiconductor diode including a body of a semiconductor material of one conductivity type having a flat surface. A guard ring region of a conductivity type opposite to that of the body is in the body at the surface of the body and extends in a closed path along the surface of the body. A metal film is over the surface of the body. The metal film includes a first portion which contacts the surface of the body within the guard ring region to form a surface barrier rectifying junction, and a second portion surrounding the first portion and extending in spaced relation to the surface of the body to at least the guard ring region.

BRIEF DESCRIPTION OF DRAWING

The FIGURE of the drawing is a sectional view of a form of the Schottky barrier diode of the present invention.

DETAILED DESCRIPTION

Referring to the drawing, the Schottky barrier diode of the present invention is generally designated as 10. Diode 10 comprises a body 12 of a semiconductor material, such as silicon, germanium of a group III–V semiconductor compound, of one conductivity type, i.e., either P type or N type. A guard ring 14 is in the semiconductor body 12 at a surface 12a of the body. The guard ring 14 is a narrow region of a conductivity type opposite to the conductivity type of the semiconductor body 12 so as to provide a PN junction between the guard ring and the body. The guard ring 14 extends along the surface 12a of the body 12 in a closed path, such as a circular, rectangular or any other desired shaped closed path, so as to provide an area of the body surface **12*a*** within the guard ring.

A layer 16 of an electrical insulating material, such as silicon dioxide, silicon nitride, aluminum oxide or combinations thereof, is coated on the surface **12*a* of the semiconductor body 12. The insulating layer 16 has an opening 18 therethrough extending to the area of the semiconductor body surface 12*a* which is within the guard ring 14. The opening 18 in the insulating layer 16 is of a size and is positioned so that the edge of the opening is spaced from the guard ring 14. The portion 16*a* of the insulating layer 16 from the edge of the opening 18 to the guard ring 14** is preferably thinner than the rest of the insulating layer.

A metal film 20 is on the semiconductor body 12. The metal film 20 has a first portion **20*a* which is within the opening 18 in the insulating layer 16 and contacts the exposed portion of the semiconductor body surface 12*a*, and a second portion 20*b* which is coated on the insulating layer 16. The second portion 20*b* of the metal film 20 surrounds the first portion 20*a* and extends over the guard ring 14. The metal film 20 is of any of the well known metals which will provide a surface barrier rectifying junction with the semiconductor material of the body 12 so that a surface barrier junction is provided between the first portion 20*a* of the metal film and the semiconductor body 12. For example, if the semiconductor body 12 is of silicon, the metal layer 20 may be of aluminum, chromium or rhodium; if the semiconductor material is germanium the metal layer 12 may be of gold or chromium and if the semiconductor material is a group III–V semiconductor compound, such as gallium arsenide, the metal film 12** may be aluminum or gold.

In the operation of the Schottky barrier diode 10, when the diode is biased in the reverse direction, at a predesigned turn-on voltage, the bias applied to the second portion **20*b* of the metal layer 20 causes the formation of a conduction channel in the semiconductor body 12 along the portion of the surface 12*a* between the first portion 20*a* of the metal layer and the guard ring 14. This conduction channel electrically connects the guard ring 14 to the metal film 20*a* so as to provide a flow of current across the PN junction of the guard ring 14 and thereby eliminate the high-field edge effect which would normally be produced by the edge of the surface barrier junction. However, when the diode 10 is biased in the forward direction no conduction channel is formed at the surface 12a of the semiconductor body 12 so that the guard ring 14 is not electrically connected to the surface barrier junction and no current flows across the PN junction between the guard ring and the semiconductor body. Thus, the diode 10 of the present invention maintains a high breakdown voltage when biased in the reverse direction because a flow of current is provided across the PN junction of the guard ring 14 to eliminate the high-field edge effect, yet the diode maintains its zero storage time characteristics when biased in the forward direction because no current is provided across the PN junction guard ring 14** to provide minority carrier current.

The Schottky barrier diode 10 can be made by first coating the surface 12a of the semiconductor body 12 with the layer 16 of the insulating material. This can be accomplished by pyrolytically decomposing a gas containing the elements of the particular insulating material to form the insulating material which deposits on the semiconductor body. For example, silicon dioxide can be formed from a mixture of silane and oxygen, silicon nitride can be formed from a mixture of silane and amonia vapors, and aluminum oxide can be formed from a mixture of aluminum chloride, carbon dioxide and hydrogen. If the semiconductor body 12 is of silicon, the insulating layer 16 can be formed by either thermal or anodic oxidation. An opening is then formed through the insulating layer over the area of the semiconductor body surface where the guard ring 14 is to be provided. This can be accomplished by providing a masking layer of a resist material over the insulating material layer except where the opening is to be formed using standard photolithographic techniques. The exposed portion of the insulating layer is then etched away with an etchant suitable for the particular insulating material used. For example, silicon dioxide can be etched with hydrofluoric acid and silicon nitride and aluminum oxide can be etched with hot phosphoric acid.

The guard ring 14 is then formed by diffusing a conductivity modifier impurity of the desired type into the exposed area of the semiconductor body surface 12a. This can be achieved either by heating the semiconductor body and exposing it to vapors of the particular conductivity modifier impurity or by coating the exposed area of the semiconductor body surface with a glass, such as silicon dioxide, which contains the conductivity modifier impurity and heating the body to diffuse the impurity into the body. If the latter technique is used, after the diffusion, the glass is removed with a suitable etchant. The appropriate dopant can also be diffused into the semiconductor body by ion implantation to form the guard ring.

The thinner portion 16a of the insulating layer can then be formed either by etching the thick layer 16 down to the desired thickness or by first completely removing the portion of the insulating layer which is over the area of the semiconductor body surface within the guard ring, such as with a suitable etchant. In the latter case, the thus exposed area of the semiconductor body surface is then recoated with the insulating material which is of the desired thickness. The opening 18 is then formed in the thinner portion 16a of the insulating layer. This can be accomplished by coating a masking layer of a resist material over the insulating layer except where the opening 18 is to be formed. The exposed portion of the insulating layer is then removed, such as by etching with a suitable etchant. The metal film 20 is then coated over the exposed area of the semiconductor body surface 12a in the opening 18 in the insulating layer and over the insulating layer, such as by any of the well known techniques of evaporating the metal in a vacuum and condensing the metal vapors on the semiconductor body surface and the insulating layer, pyrolytically decomposing a gas containing the metal and depositing the metal on the semiconductor body surface and the insulating layer, or deposition of the metal by sputtering.

What is claimed is:

1. A semiconductor device comprising
   a body of a semiconductor material of one conductivity type having a surface,
   a guard ring region of a conductivity type opposite to that of the body in the body at said surface, said guard ring region extending in a closed path along said surface, and
   a metal film over said surface of the body and completely spaced from said guard ring, said metal film having a first portion contacting said surface within the guard ring to form a surface barrier rectifying junction, and a second portion surrounding said first portion and extending in spaced relation to said surface to at least the guard ring region along the entire length of the path of the guard ring whereby under reverse bias condition a conduction channel electrically connects the metal film to the guard ring region.

2. A semiconductor device in accordance with claim 1 including a layer of an electrical insulating material between the surface of the body and the second portion of the metal film.

3. A semiconductor device comprising
   a body of a semiconductor material of one conductivity type having a surface,
   a narrow guard ring region of a conductivity type opposite to that of said body in the body at said surface, said guard ring region extending in a closed path along said surface and forming a PN junction with said body,
   a layer of an electrical insulating material on said surface of the body, said insulating layer having an opening therethrough extending to a portion of said body surface within said guard ring region, and
   a metal film on said portion of the body surface within the opening in the insulating layer and on said insulating layer, the portion of the metal film on said body surface providing a surface barrier rectifying junction with said body and the portion of the metal film on said insulating layer extending to at least the guard ring region along the entire length of the path of the guard ring region, said metal film being completely spaced from said guard ring region, the thickness of the insulating layer being such that under reverse bias condition a conduction channel electrically connects the metal layer to the guard ring region.

4. A semiconductor device in accordance with claim 3 in which the edge of the opening in the insulating layer is spaced from the guard ring region.

5. A semiconductor device in accordance with claim 4 in which the portion of the insulating layer which extends from said opening to said guard ring region is thinner than the rest of the insulating layer.

* * * * *